(12) United States Patent
Ono

(10) Patent No.: US 9,312,159 B2
(45) Date of Patent: Apr. 12, 2016

(54) TRANSPORT APPARATUS AND EXPOSURE APPARATUS

(75) Inventor: Kazuya Ono, Saitama (JP)

(73) Assignee: NIKON CORPORATION, Tokyo (JP)

( * ) Notice: Subject to any disclaimer, the term of this patent is extended or adjusted under 35 U.S.C. 154(b) by 702 days.

(21) Appl. No.: 12/795,939

(22) Filed: Jun. 8, 2010

(65) Prior Publication Data

US 2011/0001953 A1    Jan. 6, 2011

Related U.S. Application Data

(60) Provisional application No. 61/213,447, filed on Jun. 9, 2009.

(51) Int. Cl.
*H01L 21/677* (2006.01)
*G03B 27/52* (2006.01)
*H01L 21/67* (2006.01)
*G03F 7/20* (2006.01)

(52) U.S. Cl.
CPC .......... *H01L 21/67748* (2013.01); *G03B 27/52* (2013.01); *G03F 7/7075* (2013.01); *H01L 21/67126* (2013.01)

(58) Field of Classification Search
CPC ........ A61B 6/032; A61B 6/037; A61B 6/505; A61B 6/508; A61B 6/5217; A61K 31/47; G03B 27/52; G03F 7/7075; H01L 21/67126; H01L 21/67748
USPC .................. 355/53, 67, 72–77; 414/217, 149, 414/222.01, 222.13, 223.01, 804, 805, 939
See application file for complete search history.

(56) References Cited

U.S. PATENT DOCUMENTS

| | | |
|---|---|---|
| 5,969,441 A | 10/1999 | Loopstra et al. |
| 6,208,407 B1 | 3/2001 | Loopstra |
| 6,341,007 B1 | 1/2002 | Nishi et al. |
| 6,400,441 B1 | 6/2002 | Nishi et al. |
| 6,549,269 B1 | 4/2003 | Nishi et al. |

(Continued)

FOREIGN PATENT DOCUMENTS

| | | |
|---|---|---|
| EP | 1 260 720 A2 | 11/2002 |
| JP | A-06-089934 | 3/1994 |

(Continued)

OTHER PUBLICATIONS

International Search Report dated Nov. 4, 2010 in International Application No. PCT/JP2010/060157.

(Continued)

*Primary Examiner* — Toan Ton
*Assistant Examiner* — Mona M Sanei
(74) *Attorney, Agent, or Firm* — Oliff PLC

(57) ABSTRACT

A substrate is transported between a first space and a second space, which are separated by a partition wall, through an opening portion formed in the partition wall. A transport apparatus includes a support device having a support portion which supports the substrate, the support device being provided so as to block the opening portion while a clearance between the partition wall and the support device is formed, the support device moving the support portion from a state where the support portion faces the first space to a state where the support portion faces the second space; and an adjustment device which adjusts an amount of the clearance, thereby suppressing the movement of fluid from the first space to the second space.

25 Claims, 11 Drawing Sheets

(56) References Cited

U.S. PATENT DOCUMENTS

| | | | |
|---|---|---|---|
| 6,590,634 B1 | 7/2003 | Nishi et al. | |
| 6,611,316 B2 | 8/2003 | Sewell | |
| 6,842,221 B1 | 1/2005 | Shiraishi | |
| 6,897,963 B1 | 5/2005 | Taniguchi et al. | |
| 7,057,711 B2* | 6/2006 | del Puerto et al. | 355/75 |
| 7,066,703 B2 | 6/2006 | Johnson | |
| 2002/0024647 A1 | 2/2002 | Nakahara et al. | |
| 2002/0176061 A1 | 11/2002 | Sai | |
| 2003/0035705 A1* | 2/2003 | Johnson | 414/217 |
| 2005/0231694 A1* | 10/2005 | Kolesnychenko et al. | 355/53 |
| 2009/0308219 A1 | 12/2009 | Yamamoto et al. | |

FOREIGN PATENT DOCUMENTS

| | | |
|---|---|---|
| JP | A-07-305165 | 11/1995 |
| JP | A-10-163099 | 6/1998 |
| JP | A-10-214783 | 8/1998 |
| JP | A-11-194479 | 7/1999 |
| JP | A-2000-12453 | 1/2000 |
| JP | A-2000-29202 | 1/2000 |
| JP | A-2000-031007 | 1/2000 |
| JP | A-2000-505958 | 5/2000 |
| JP | A-2002-349569 | 12/2002 |
| JP | A-2004-103824 | 4/2004 |
| JP | A-2004-168481 | 6/2004 |
| JP | A-2004-179567 | 6/2004 |
| JP | A-2005-32510 | 2/2005 |
| JP | A-2009-004508 | 1/2009 |
| TW | 577854 B | 3/2004 |
| TW | 200728218 | 8/2007 |
| WO | WO 99/34255 A1 | 7/1999 |
| WO | WO 99/50712 A1 | 10/1999 |
| WO | WO 99/66370 A1 | 12/1999 |
| WO | WO 01/70605 A1 | 9/2001 |

OTHER PUBLICATIONS

Written Opinion of the International Searching Authority dated Nov. 4, 2010 in International Application No. PCT/JP2010/060157.

Dec. 17, 2013 Office Action issued in Japanese Patent Application No. 2011-552115 (with translation).

Jun. 3, 2014 Office Action issued in Japanese Patent Application No. 2011-552115 (with translation).

Feb. 12, 2015 Office Action issued in Taiwanese Application No. 099118708.

* cited by examiner

TRANSPORT APPARATUS AND EXPOSURE APPARATUS

CROSS-REFERENCE TO RELATED APPLICATION

This application is a non-provisional application claiming priority to and the benefit of U.S. provisional application No. 61/213,447, filed Jun. 9, 2009. The entire contents of which are incorporated herein by reference.

BACKGROUND

The present invention relates to a transport apparatus and an exposure apparatus.

In an exposure apparatus which is used in a photolithography process, there is proposed an EUV exposure apparatus which uses extreme ultra-violet (EUV) light as exposing light, such as that disclosed in, for example, JP-A-2005-032510.

In the past, in this kind of exposure apparatus, a photosensitive substrate such as a wafer has been transported into a vacuum chamber, and as the technology for shortening transport time, there is disclosed technology in which a plurality of (in JP-A-2004-179567, three-consecutive) load lock chambers which are divided by partition walls with slits formed therein and have a gradual increase in a degree of vacuum are provided and the photosensitive substrate passes in sequence the plurality of load lock chambers through the slits of the partition walls, as disclosed in, for example, JP-A-2004-179567.

SUMMARY

In the background arts as mentioned above, the apparatus may become larger in size due to a plurality of load lock chambers being provided.

Also, in recent years, in accordance with thinner pattern lines, the required degree of vacuum is increased, and in order to meet the need, it is necessary to increase the number of load lock chambers or include a pump to increase exhaust capability, thereby causing further increases in the size and price of the apparatus.

Also, in the case of sequentially increasing the degrees of vacuum by using a plurality of load lock chambers, since exhaust time in each load lock chamber is necessary, the throughput of an exposure treatment of the photosensitive substrate is lowered.

Some aspects of the present invention has an object to provide a transport apparatus and an exposure apparatus, which is able to provide a high throughput and a high degree of vacuum while suppressing an increase in size and a higher price of the apparatus.

An aspect of the present invention provides a transport apparatus which transports a substrate between a first space and a second space, which are separated by a partition wall, through an opening portion formed in the partition wall, and includes a support device having a support portion which supports the substrate, the support device being provided so as to block the opening portion and to form a clearance between the partition wall and the support device, the support device moving the support portion from a state where the support portion faces the first space to a state where the support portion faces the second space; and an adjustment device which adjusts the clearance, thereby suppressing the movement of fluid from the first space to the second space.

Another aspect of the present invention provides a transport apparatus which transports a substrate between a first space and a second space, which are separated by a partition wall, and includes a support device having a support portion which supports the substrate and moves between the first space and the second space; a third space which is connected to the first space and the second space and forms at least a portion of a movement pathway of the support device; and an exhaust device which exhausts gas in the third space, wherein the exhaust device have a plurality of exhaust portions which has different exhaust characteristics and is disposed in order along the movement pathway of the substrate.

Another aspect of the present invention provides an exposure apparatus that is provided with the transport apparatus described previously.

Another aspect of the present invention provides a chamber device that includes a communication space which has an opening portion facing the internal space and makes the internal space communicate with an external space; and a suction device which has a suction port provided at the communication space.

Some aspects of the present invention can provide a high degree of vacuum while suppressing increases in the size and price of the apparatus.

DESCRIPTION OF EMBODIMENTS

Hereinafter, embodiments of a transport apparatus and an exposure apparatus according to the present invention will be described with reference to FIGS. 1 to 12. In this embodiment, a case where, in an EUV exposure apparatus which performs exposure of a substrate by extreme ultra-violet (EUV) light, the substrate is transported between a clean room under atmospheric pressure and the exposure apparatus substantially in a vacuum state in the clean room, is taken and described as an example.

Also, in the following explanation, an XYZ orthogonal coordinate system is set, and a positional relationship between the respective members is described with reference to the XYZ orthogonal coordinate system. In each of the following drawings, a given direction in the horizontal plane is defined as an X-axis direction, a direction orthogonal to the X-axis direction in the horizontal plane is defined as a Y-axis direction, and a direction (that is, the vertical direction) orthogonal to each of the X-axis direction and the Y-axis direction is defined as a Z-axis direction. Rotation (tilt) directions about an X-axis, a Y-axis and a Z-axis are respectively defined as the θX direction, the θY direction, and the θZ direction.

Also, a case where a semiconductor wafer (hereinafter simply referred to as a wafer) for manufacturing a semiconductor device is used as a substrate is explained as an example. However, the substrate is not to be limited thereto.

First Embodiment

Figure 1:
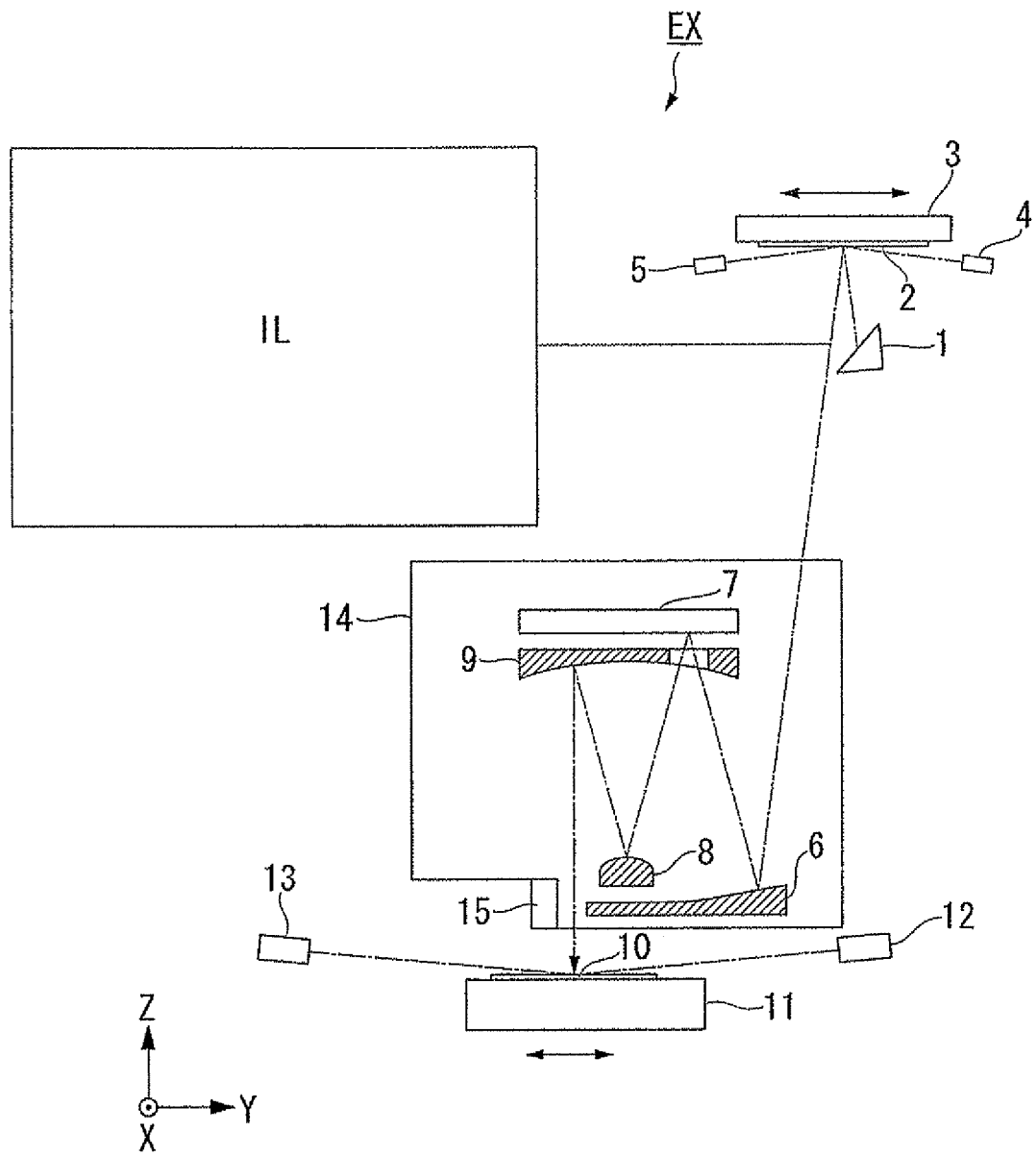
FIG. 1 is a schematic configuration diagram illustrating one example (4-sheet projection system) of an EUV exposure apparatus.

An EUV exposure apparatus EX shown in FIG. 1 is provided with an illumination system IL which includes a light source. EUV light (in general, a wavelength in the range of 5 nm to 20 nm is used, and specifically, a wavelength of 13 nm or 11 nm is used) radiated from the illumination system IL is reflected by a folding mirror 1, thereby being irradiated onto a reticle (mask) 2.

The reticle 2 is held in a reticle stage 3. The reticle stage 3 has a stroke of 100 mm or more in a scanning direction (the Y axis), a minute stroke in a direction (the X axis) orthogonal to the scanning direction in a reticle plane, and a minute stroke also in an optical axis direction (the Z axis). Positions in the X and Y directions are monitored by a laser interferometer (not shown) with high precision, and a position in the Z direction is monitored by a reticle focus sensor which is composed of a reticle focus light-transmitting system 4 and a reticle focus light-receiving system 5.

The EUV light reflected by the reticle 2 enters into an optical mirror barrel 14 on the lower side of the drawing. The EUV light contains information on a circuit pattern drawn on the reticle 2. A multilayer film (for example, Mo/Si or Mo/Be) which reflects the EUV light is formed on the reticle 2, and a pattern is made on this multilayer film by the existence or nonexistence of an absorption layer (for example, Ni or Al).

The EUV light entering into the optical mirror barrel 14 is reflected by a first mirror 6, then reflected in order by a second mirror 7, a third mirror 8, and a fourth mirror 9, and finally enters vertically with respect to a wafer (substrate) 10. A reduction magnification of a projection system is ¼ or ⅕, for example. There are four mirrors in this drawing. However, in order to make N.A. larger, it is effective if six or eight mirrors are provided. An off-axis microscope 15 for alignment is disposed in the vicinity of the mirror barrel 14.

The wafer 10 is carried on a wafer stage 11. The wafer stage 11 can freely move in a plane (an X-Y plane) orthogonal to an optical axis, and a stroke thereof is in the range of 300 mm to 400 mm, for example. An upward and downward minute stroke of the wafer stage 11 in the optical axis direction (the Z axis) is also possible, and a position in the Z direction is monitored by a wafer focus sensor which is composed of a wafer autofocus light-transmitting system 12 and a wafer autofocus light-receiving system 13. Positions in the X and Y directions of the wafer stage 11 are monitored by a laser interferometer (not shown) with high precision. In an exposure operation, the reticle stage 3 and the wafer stage 11 perform synchronous scanning at the same velocity ratio as the reduction magnification of the projection system, that is, 4:1 or 5:1.

Next, a main chamber and a substrate transport apparatus of the exposure apparatus EX will be described.

Figure 2:
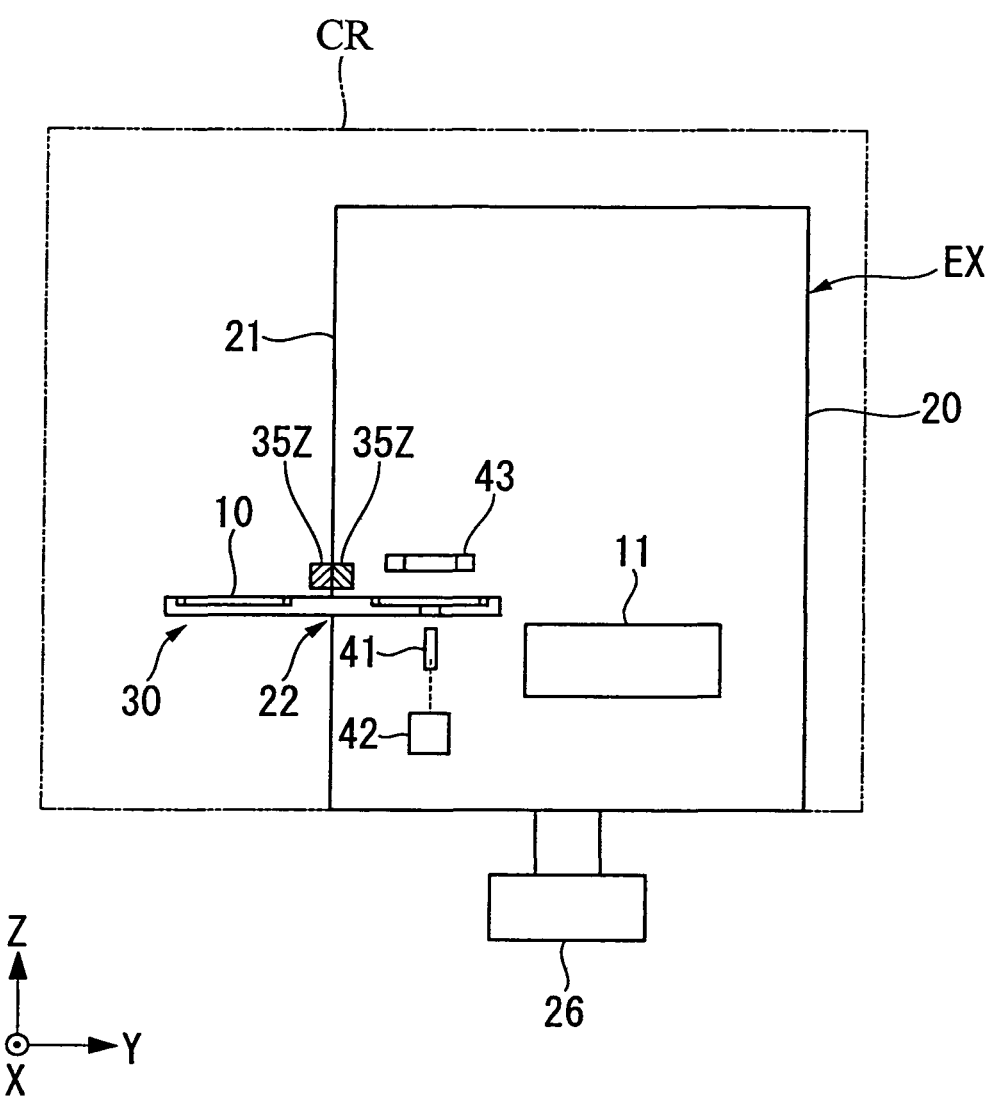
FIG. 2 is a diagram schematically illustrating a chamber and a transport apparatus of an exposure apparatus according to the present invention.

FIG. 2 is a diagram schematically illustrating the main chamber and the substrate transport apparatus of the exposure apparatus EX according to the present invention. The exposure apparatus EX is provided in a clean room (a first space) CR which is a space with managed air pressure (atmospheric pressure), humidity, temperature, and so on.

A mirror barrel which includes the illumination system IL, the optical mirror barrel 14, and so on. (refer to FIG. 1) are contained in a chamber (a second space) 20 which is a space separated (divided) from the clean room CR. Then, the exposure apparatus EX as shown in FIG. 1 is disposed in the chamber 20. In addition, in FIG. 2, among the exposure apparatus EX, the wafer stage 11 for carrying and positioning the wafer W is selected and shown. An exhaust system 26 which includes a turbo-molecular pump, an initial roughing pump, or the like is connected to the lower side in the drawing of the chamber 20. The inside of the chamber 20 is exhausted from the atmospheric pressure up to the order of $10^{-4}$ Pa by the exhaust system 26.

In this manner, a relationship is made that the clean room CR (the first space) is a first pressure chamber set to have a first pressure and the chamber 20 (the second space) is a second pressure chamber set to have second pressure. However, the invention is not to be limited to such a configuration, but the first space and the second space may also be set to have the same pressure. In the embodiment, at least the movement of the gas (i.e., the flow of the fluid) from the first space to the second space is suppressed. Also, the movement of the gas (i.e., the flow of the fluid) from the first space to the second space can be suppressed.

Also, for example, a case is also acceptable where the kinds of gas of the first space and the second space are set to be different from each other and the mixing of the gases together is prevented. In this case, both the movement of the gas (i.e., the flow of the fluid) from the first space to the second space and the movement of the gas (i.e., the flow of the fluid) from the second space to the first space can be suppressed.

In one embodiment or in the other embodiments, a space (or an air pressure chamber) is not to be particularly limited to a hermetically-sealed or closed space, but may also be, for example, a partly opened space, provided that a state in the space can be maintained. For example, it can be that at the peripheries of the first and second spaces with the partition wall interposed therebetween, fluid in each space be maintained in a given state. However, in a case where there is no need to strictly set a state of the periphery of the partition wall rather than a position apart from the partition wall, or the like, there is a case where a space does not need to be a hermetically-sealed or closed space. Even in such a case, one embodiment and the other embodiments treat it as a space (or it may also be airspace).

Figure 3:
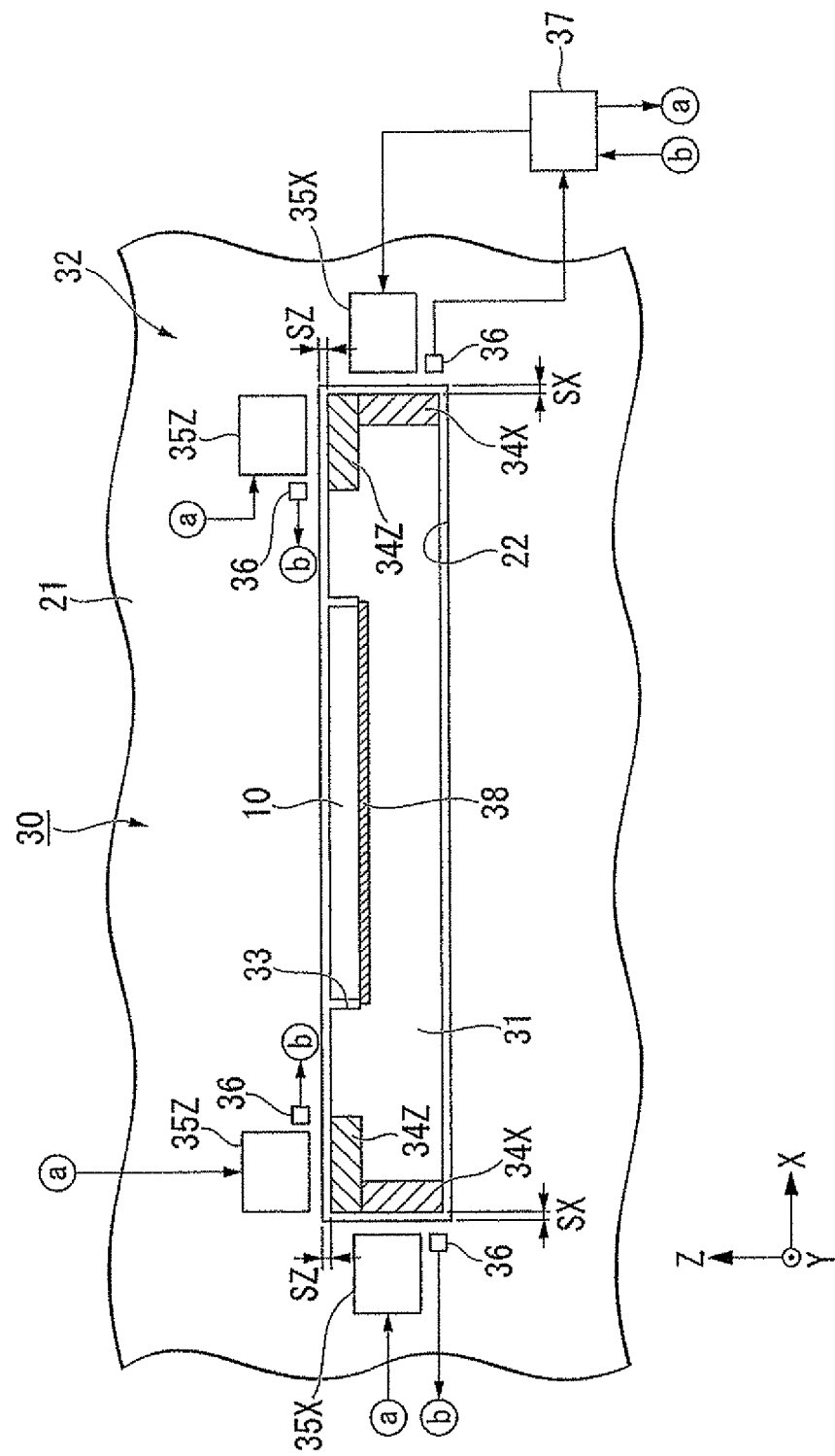
FIG. 3 is a configuration diagram illustrating an opening portion and the transport apparatus.

In a partition wall 21 which forms the chamber 20, an opening portion (a connection portion) 22 is formed which becomes a pathway when transporting the wafer 10 between the clean room CR and the inside of the chamber 20. The opening portion 22 has a cross-section shape of substantially a rectangle having a longitudinal direction extending the X-axis direction (the horizontal direction), as shown in FIG. 3. One side of the opening portion is opened facing the inside of the clean room CR and the other end of the opening portion is opened facing the inside of the chamber 20, whereby the opening portion connects both spaces. Also, as shown in FIG.

5, in the partition wall 21, exhaust ports 21a which are opened facing the opening portion 22 are formed in faces on the +Z side and the −Z side, respectively. Each exhaust port 21a is constituted to be connected to the exhaust system 26, thereby exhausting gas which exists in the inside of the opening portion 22 and the periphery of the opening portion 22.

Also, the exposure apparatus EX of this embodiment is provided with a transport apparatus 30 which transports the wafer 10 through the opening portion 22.

Figure 4:
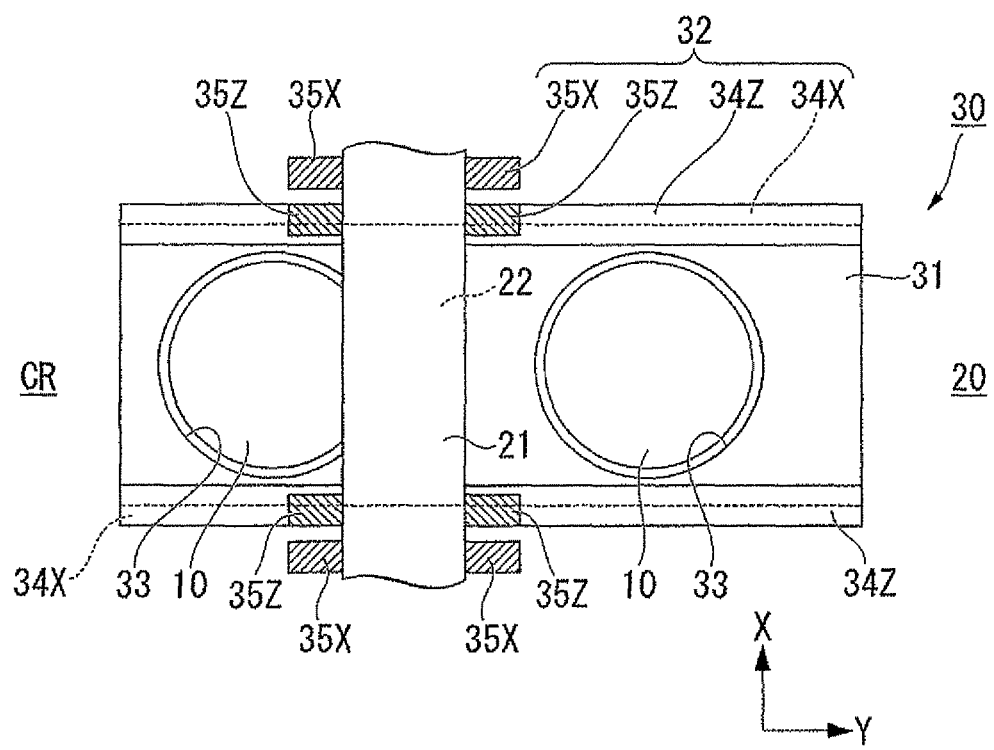
FIG. 4 is a plan view showing a schematic configuration of the transport apparatus.
Figure 5:
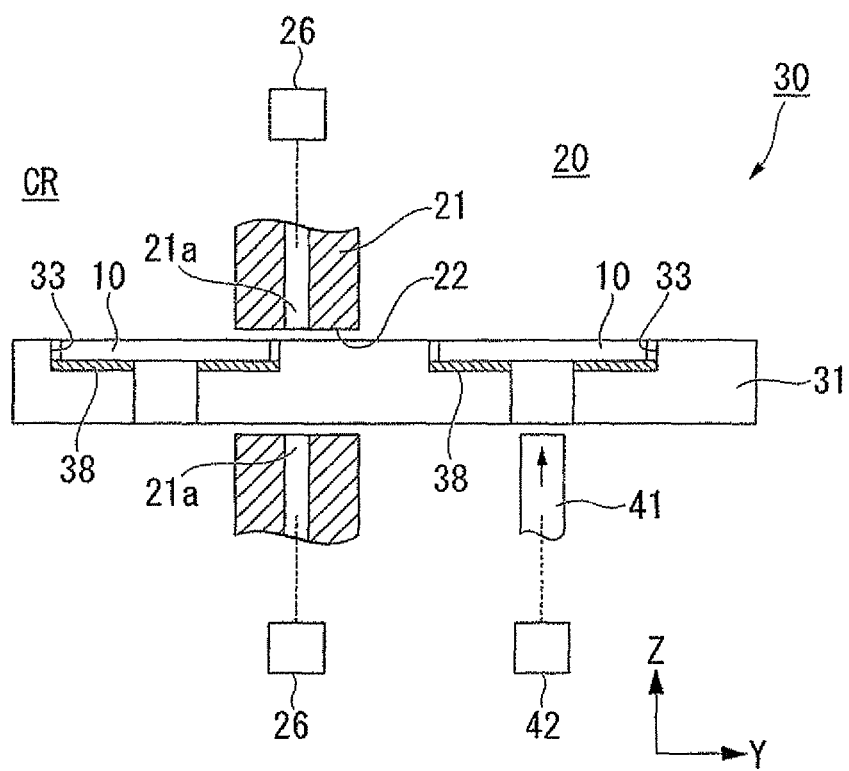
FIG. 5 is a front elevational view in cross-section showing a schematic configuration of the transport apparatus.

The transport apparatus 30 has a load plate (a support device) 31, a driving device (not shown) which reciprocates the load plate 31 in the Y direction in a state where the load plate 31 is inserted into the opening portion 22, and an adjustment device 32 which adjusts a clearance between the load plate 31 and the opening portion 22, as shown in FIGS. 3 to 5. The load plate 31 is a plate-like member extending in the Y direction and has an outer shape (the width in the X direction and the thickness in the Z direction) which forms a clearance of a minutely small amount (for example, several µm) between the load plate and the opening portion 22, as shown in FIG. 3. In the surface (the face on the +Z side) of the load plate 31, a support portion 33 is formed which is composed of a recessed portion of a circular shape in a plan view which supports the wafer 10 and is formed to have a diameter larger than the outer shape of the wafer 10 and a depth that is substantially the same as the thickness of the wafer 10. A gap between the side of the wafer 10 and a wall surface of the support portion 33 is set to be in the range of several tens to several hundreds of microns, and dimensions are set such that gas does not move through the gap (clearance). In this embodiment, a case where a plurality of (in FIG. 2, two) support portions 33 are provided being spaced in the Y direction is shown. However, the support portion 33 may also be provided at one place.

The load plate 31 undergoes reciprocal movement in the Y direction due to the driving device in a state where the load plate is inserted into the opening portion 22, and thus the support portion 33 undergoes reciprocal movement between the clean room CR which becomes the outside of the chamber 20 (the outside of the partition wall 21) and the inside of the chamber 20 (the inside of the partition wall 21) through the opening portion 22. Therefore, the wafer 10 to be exposed after this can be transported from the outside to the inside of the chamber 20 while being supported by the support portion 33, or the exposed wafer 10 can be transported from the inside to the outside of the chamber 20.

Figure 13:
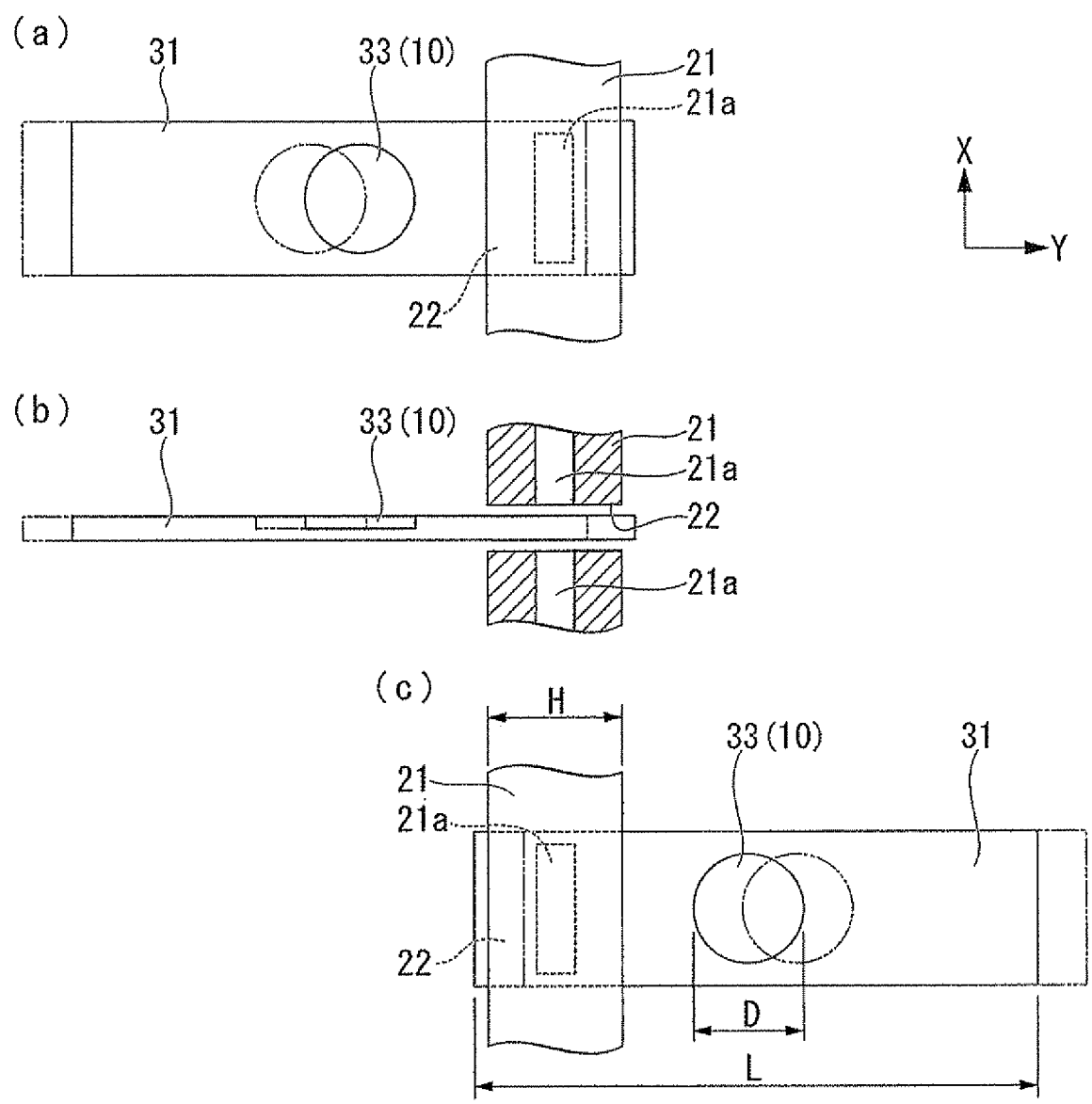
FIG. 13 is a diagram for explaining transport of the wafer by a load plate.

Here, a position of the load plate 31 when the wafer 10 is disposed on the support portion 33 of the load plate 31 and taken out of the support portion 33 at the outside of the chamber 20 is defined as a first position (a position shown in part (a) and part (b) of FIG. 13). Also, the position of the load plate 31 when the wafer 10 is disposed on the support portion 33 of the load plate 31 and taken out of the support portion 33 at the inside of the chamber 20 is defined as a second position (a position shown in part (c) of FIG. 13). For example, when the load plate 31 is at the first position, a new wafer to be subjected to an exposure treatment after this is taken out of a wafer cassette or the like and disposed on the support portion 33. Thereafter, the load plate 31 moves from the first position toward the second position in a state where the wafer is supported by the support portion 33 (a transport operation), so that the wafer is transported into the chamber 20 through the opening portion 22. If the load plate 31 reaches the second position, the wafer on the support portion 33 is taken out, for example, by an arm mechanism or the like and disposed on the wafer stage 11 of the exposure apparatus EX, and then a given exposure treatment is performed. The wafer with the exposure treatment finished is transferred from the wafer stage 11 to the support portion 33 of the load plate 31 which waits at the second position, and then the load plate 31 moves toward the first position, thereby being transported to the outside of the chamber 20. Then, if the load plate 31 reaches the first position, the wafer is taken out of the support portion 33 and transported by another transport apparatus or the like in order to perform a development treatment or the like.

A dimension related to the Y direction of the load plate 31 is set to be larger than the summed dimensions of a dimension related to the Y direction of the partition wall 21 in the opening portion 22 and a dimension related to the Y direction of the wafer 10 (for example, the diameter of the wafer 10), as shown in FIG. 13. In part (c) of FIG. 13, when a dimension in the Y direction of the load plate 31 is L, a dimension related to the Y direction of the partition wall 21 in the opening portion 22 is H, and a dimension related to the Y direction of the wafer 10 (for example, the diameter of the wafer 10) is D, L is larger than the summed dimensions of H and D (L>H+D).

However, the setting of the dimensions is not to be limited thereto, but the setting may also be made such that the relationship of L=H+D is established.

Further, in the case of this embodiment, when the load plate 31 is at the first position, as shown in part (a) and part (b) of FIG. 13, a portion of the load plate 31 is in a state where it has passed through the opening portion 22. Also, when the load plate 31 is at the second position, as shown in part (c) of FIG. 13, a portion (an end portion on the opposite side to that when the load plate is at the first position) of the load plate 31 is in a state where it has passed through the opening portion 22.

Thus, during the transport operation of the wafer 10 involved in an exposure treatment (for example, a ease where the wafer 10 is moved between the chamber 20 and the clean room CR in a state where the inside of the chamber 20 is set to be a given degree of vacuum), it becomes possible to make a portion of the load plate 31 always pass through the opening portion 22 and also appropriately adjust a clearance between the partition wall 21 and the load plate 31 by the adjustment device 32. Therefore, the movement of gas between the inside of the chamber 20 and the clean room CR through the opening portion 22 can be prevented (regulated), so that it becomes possible to maintain the inside of the chamber 20 in a given vacuum state. In other words, the wafer 10 is transported in a state where vacuum is maintained.

In addition, as shown by a two-dot chain line in part (a) to (c) of FIG. 13, the load plate 31 may also be in a state where the load plate does not pass through the opening portion 22, but is inserted into the opening portion 22 up to a mid-point in a direction along the movement pathway of the load plate 31. Also in this case, since the opening portion 22 is not opened (fully opened), it is possible to prevent (regulate) the movement of gas between the inside of the chamber 20 and the clean room CR through the opening portion 22. At this time, it is possible to appropriately set the insertion amount (a dimension in the Y direction) of the load plate 31 into the opening portion 22 in accordance with, for example, the quantity of the flow of gas which is sucked by the exhaust port 21a, the stopped time of the load plate 31, or the like. However, for example, during the transport operation, a setting may also be made such that the load plate 31 is in a state where it always faces the exhaust port 21a (a state shown by a two-dot chain line in part (a) and part (b) of FIG. 13. Also, it is preferable if a setting is made such that the load plate 31 and the inner wall surface of the opening portion 22 face each other in the order of several tens of mm before and after the exhaust port 21 a in the Y direction (a moving direction). However, the invention is not to be limited thereto.

In this manner, the load plate 31 functions as an isolation member which isolates the clean room CR from the chamber 20.

In addition, the driving device is constituted so as to drive the load plate 31 (the support portion 33) only in a linear motion direction (the Y direction). However, the driving is not to be limited thereto. Also, a driving method is also not to be particularly limited. For example, a driving method which uses a linear motor, a ball screw, or the like can be used.

Also, an electrostatic chuck device 38 which sucks and attaches the wafer 10 to the load plate 31 (the support portion 33) by an electrostatic force is provided at the support portion 33. In addition, the wafer 10 may also be supported by a method other than an electrostatic chuck.

The adjustment device 32 is mainly constituted by guide portions 34Z and 34X, electromagnets (magnet generation devices) 35Z and 35X, a measuring device 36, and a control device 37.

The guide portions 34Z are formed of a magnetic material and respectively buried over almost the entire length in edges on both sides in the width direction (the X direction) of the upper face of the load plate 31. The guide portions 34X are formed of a magnetic material and respectively buried over almost the entire length in both side surfaces in the width direction (the Z direction or the thickness direction) of the load plate 31. The electromagnets 35Z are provided on both sides in the Y direction of the partition wall 21 and respectively disposed facing the guide portions 34Z, as shown in FIG. 4. The electromagnets 35X are provided on both sides in the Y direction of the partition wall gland respectively disposed facing the guide portions 34X. The measuring devices 36 respectively measure distances in the Z direction and the X direction between the measuring device and the load plate 31 and output the measured values to the control device 37 and are respectively provided in the vicinities of the electromagnets 35X and 35Z. The control device 37 is to adjust the distances between the respective electromagnets 35Z and 35X and the respective guide portions 34Z and 34X by controlling the amount of energization to the electromagnets 35Z and 35X in accordance with the measurement results of the measuring device 36.

Also, as shown in FIGS. 2 and 5, a lift pin 41 which sucks and holds the transported wafer 10 from below, thereby moving it up and down, and a driving device 42 which moves the lift pin 41 up and down along the Z direction are provided under (at a position on the −Z side) the support portion 33 of the load plate 31 in the chamber 20.

On the other hand, a transport arm 43 which transports the wafer 10 between the support portion 33 and the wafer stage 11 is provided above (at a +position on the −Z side) the support portion 33 of the load plate 31 in the chamber 20.

In addition, there is no need to necessarily use the lift pin 41 when taking the wafer 10 out of the support portion 33 or disposing the wafer on the support portion 33, and such an operation may also be performed by another method. For example, the operation may also be performed by using an arm or the like from above the wafer 10.

Subsequently, an operation for transporting the wafer 10 between the clean room CR and the chamber 20 in the exposure apparatus EX is described.

The wafer 10 held on the support portion 33 moves (is transported) between the clean room CR and the chamber 20 through the opening portion 22 by the movement of the load plate 31 in the Y direction by the driving of the driving device. Also, gas (air) flowing in from the clean room CR through a clearance between the partition wall 21 and the load plate 31 is exhausted through the exhaust port 21a by the exhaust system 26.

At this time, as shown in FIG. 3, the amount of clearance SZ in the Z direction and the amount of clearance SX in the X direction between the load plate 31 and the partition wall 21 in the opening portion 22 are measured and outputted to the control device 37 by the measuring device 36. The control device 37 adjusts the suction power to the guide portions 34Z and 34X by the electromagnets 35Z and 35X by adjusting the amount of energization to the electromagnets 35Z and 35X according to the direction of the clearance such that the measured amounts of clearance SZ and SX fall within allowable values. By this, for example, even in a case where the amounts of clearance are enlarged over the allowable values, it is possible to perform control such that the amounts of clearance fall within the allowable values.

Also, in a case where a difference occurs in the measurement results of the measuring device 36 for each direction, so that the inclination of the load plate 31 which is more than the allowable value with respect to the opening portion 22 in the θZ direction (the rotation direction about the Z axis: a yawing direction), the θY direction (the rotation direction about the Y axis: a rolling direction), and the θX direction (the rotation direction about the X axis: a pitching direction) is detected, the control device 37 can correct the inclination of the load plate 31 by adjusting the amount of energization to each of a plurality of measuring devices 36 corresponding to the respective directions. Accordingly, in this embodiment, it is possible to transport the wafer 10 between the clean room CR and the chamber 20 without the load plate 31 and the partition wall 21 coming into contact with or interfering with each other.

In this manner, in this embodiment, when the wafer 10 is transported through the opening portion 22 by the movement of the load plate 31, the adjustment device 32 adjusts a clearance between the partition wall 21 and the load plate 31, thereby allowing such contact or interference to be prevented.

In this manner, in this embodiment, it is possible to make the opening portion 22 be in a state where the opening portion is nearly blocked by at least a portion of the load plate 31 while a clearance between the partition wall 21 and the load plate 31 is formed, and it is possible to set the amount of clearance between the partition wall 21 and the load plate 31 to be a minutely small amount. Therefore, that the opening portion 22 is free, whereby the flow of gas from the opened portion into the chamber 20 can be prevented.

Also, since gas flowing from the clean room CR into the clearance is exhausted through the exhaust port 21a by the exhaust system 26, it becomes possible to easily increase the degree of low pressure (the degree of vacuum) of the chamber 20, it is possible to prevent increases in the size and price of the apparatus, as in the case of connecting and using a plurality of chambers, and also it is possible to improve throughput without the requirement of wasted time until the inside of the chamber 20 is made to be at a low pressure.

In addition, the driving device and the adjustment device 32 may also be integrally constituted. In this case, for example, it is preferable if the driving device is made so as not only to linearly move the load plate 31 (the support portion 33) in the Y direction, but also to move the load plate 31 (the support portion 33) in the X direction, the Z direction, the θZ direction, the θY direction, and the θX direction. It is possible to apply a driving device of a stage capable of moving with 6 DOFs, or the like.

Also, in this embodiment, since the depth of the recessed portion which forms the support portion 33 is substantially equal to the thickness of the wafer 10, the upper surface of the wafer 10 and the upper surface of the load plate 31 can be substantially flush with each other, so that a protruded stepped portion can be prevented from coming into contact with the partition wall 21, as in a case where a stepped portion exists, or air in the clean room CR can be prevented from flowing into the chamber 20 through an inversely recessed stepped portion, thereby diminishing the degree of low pressure.

Also, the exposure apparatus EX of this embodiment is provided with the transport apparatus 30 described above, so that a reduction in size, a lower price, and higher throughput of the apparatus can be realized.

Second Embodiment

Subsequently, a second embodiment of the transport apparatus will be described with reference to FIGS. 6 to 9.

In these drawings, the same elements as the constituent elements of the first embodiment shown in FIGS. 1 to 5 are designated by the same reference numerals and an explanation thereof is omitted.

Figure 6:
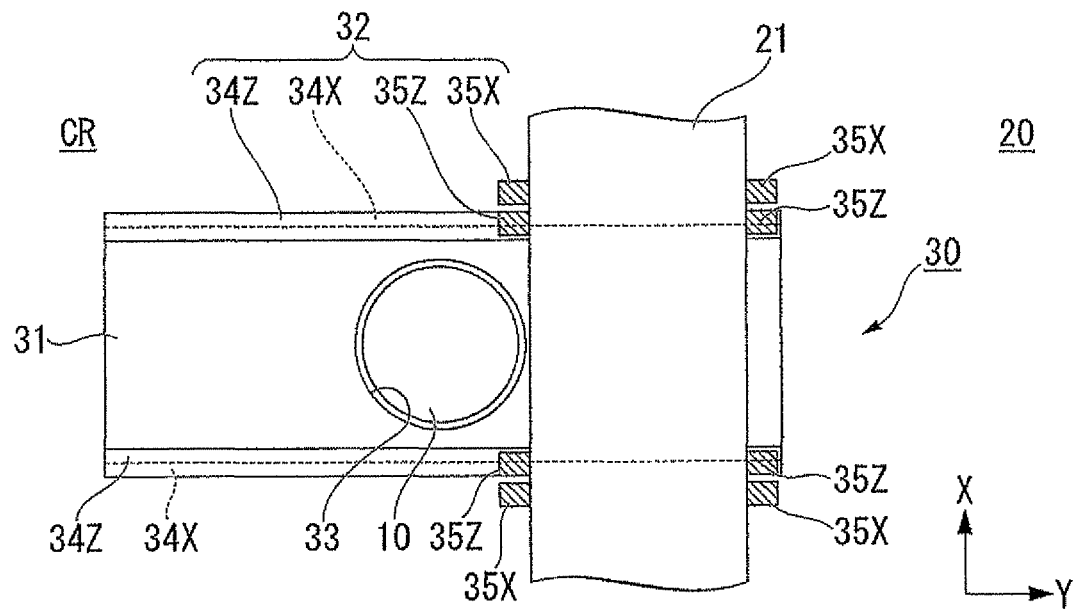
FIG. 6 is a plan view showing a schematic configuration of a transport apparatus related to a second embodiment.

As shown in FIG. 6, in this embodiment, the support portion 33 is provided at substantially the central portion of the load plate 31 in a longitudinal direction. Then, the length in the wafer transport direction (the Y direction) of the partition wall 21 is set to be larger than the outer diameter of the wafer 10, more specifically, to be larger than the outer diameter of the support portion 33. Accordingly, the length of the load plate 31 is made to be equal to or more than three times the length (the diameter) of the wafer 10 so as to allow the support portion 33 to be exposed to both the clean room CR and the chamber 20.

Figure 7:
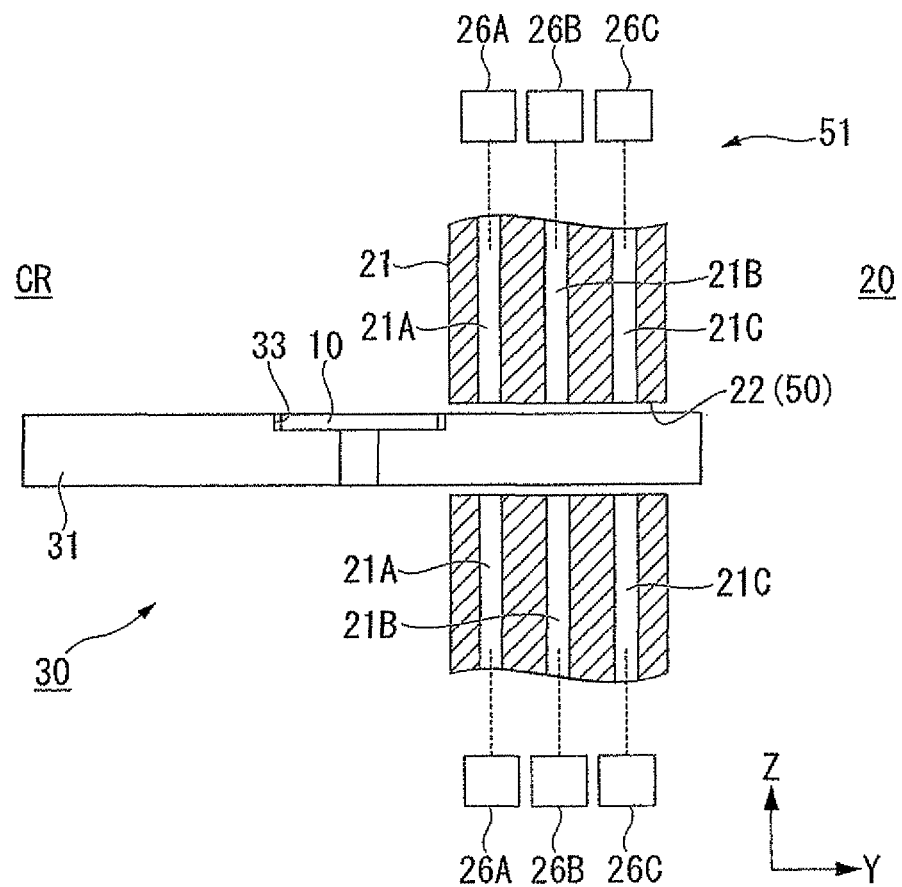
FIG. 7 is a front elevational view in cross-section showing a schematic configuration of the transport apparatus related to the second embodiment.

Also, as shown in FIG. 7, the opening portion 22 formed in the partition wall 21 so as to make the load plate 31 pass therethrough forms a third air pressure chamber 50 which connects the clean room CR and the chamber 20. In this embodiment, a suction device 51 is provided which exhausts the third air pressure chamber 50 by a plurality of (here, three) suction portions 21A to 21C which are disposed in order along the wafer transport direction from the clean room CR side and are different in the negative-pressure suction characteristic. In addition, a plurality of suction portions 21A to 21C does not need to be disposed on the same straight line (for example, in the drawing, the X axes are the same), but may also be in a state where they are shifted from each other in the X direction.

A scroll pump 26A, in which the degree of vacuum to be attained is several KPa and an exhaust velocity (exhaust capacity) is large, is connected to the suction portion 21A. A dry pump 26B, in which the degree of vacuum to be attained is several hundreds of Pa and an exhaust velocity (exhaust capacity) is smaller than that of the scroll pump 26A, is connected to the suction portion 21B. Also, a turbo-molecular pump 26C, in which the degree of vacuum to be attained is several tens of Pa and an exhaust velocity (exhaust capacity) is smaller than those of the scroll pump 26A and the dry pump 26B, is connected to the suction portion 21C. That is, in this embodiment, the suction amounts become larger from the clean room CR side being higher in air pressure, among the first and second air pressure chambers, toward the chamber 20 side being lower in air pressure, and the suction portions are disposed in order from the suction portion 21A having a smaller suction power to the suction portion 21C having a smaller amount of negative-pressure suction and a larger suction power.

Other configurations are the same as those of the first embodiment.

Also, in the transport apparatus 30 having the above-described configuration, the load plate 31 moves in the Y direction by the driving of the driving device, thereby moving (being transported) between the clean room CR and the chamber 20 through the third air pressure chamber 50 (the opening portion 22). Here, air flowing in from the clean room CR through a clearance between the partition wall 21 and the load plate 31 is exhausted from the suction portion 21A by the driving of the scroll pump 26A. Also, air heading toward the chamber 20 without being fully exhausted from the suction portion 21 is exhausted from the suction portion 21B by the driving of the dry pump 26B having a larger attainable vacuum. Further, air heading toward the chamber 20 without being fully exhausted from the suction portion 21 is exhausted from the suction portion 21C by the driving of the turbo-molecular pump 26C having the further larger attainable vacuum.

Figure 8:
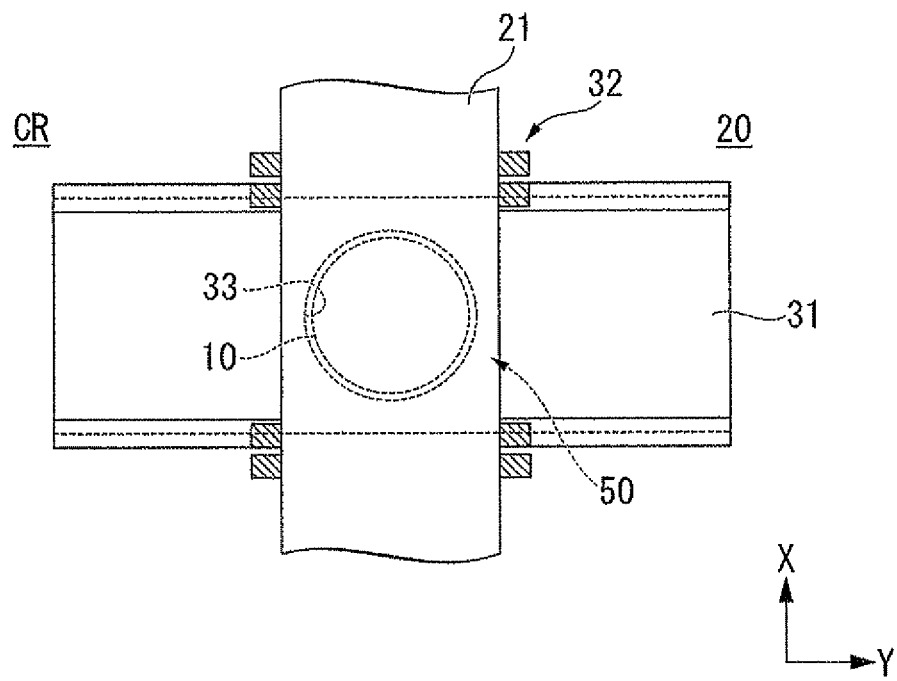
FIG. 8 is a diagram for explaining transport of a wafer by the transport apparatus.
Figure 9:
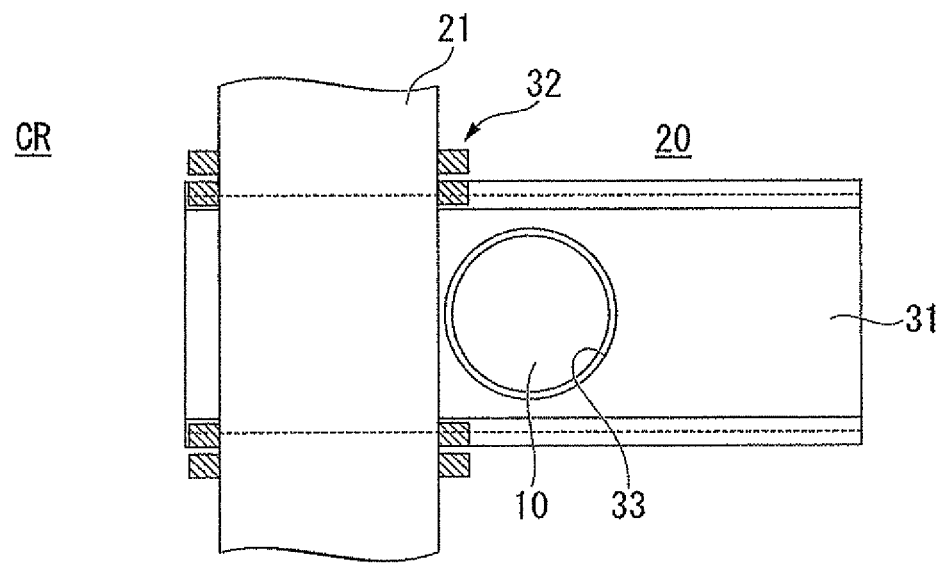
FIG. 9 is a diagram for explaining transport of the wafer by the transport apparatus.

Also, as shown in FIG. 8, when the wafer 10 reaches the third air pressure chamber 50, since the length in the Y direction of the partition wall 21 is larger than the outer diameters of the wafer 10 and the support portion 33, the clearance between the wafer 10 and the support portion 33 is not exposed to both the clean room CR and the chamber 20. Therefore, the clearance becomes a flow path, whereby air in the clean room CR that flows into the chamber 20 is blocked, and as shown in FIG. 9, the wafer 10 can be transported to the chamber 20 without trouble.

Figure 14:
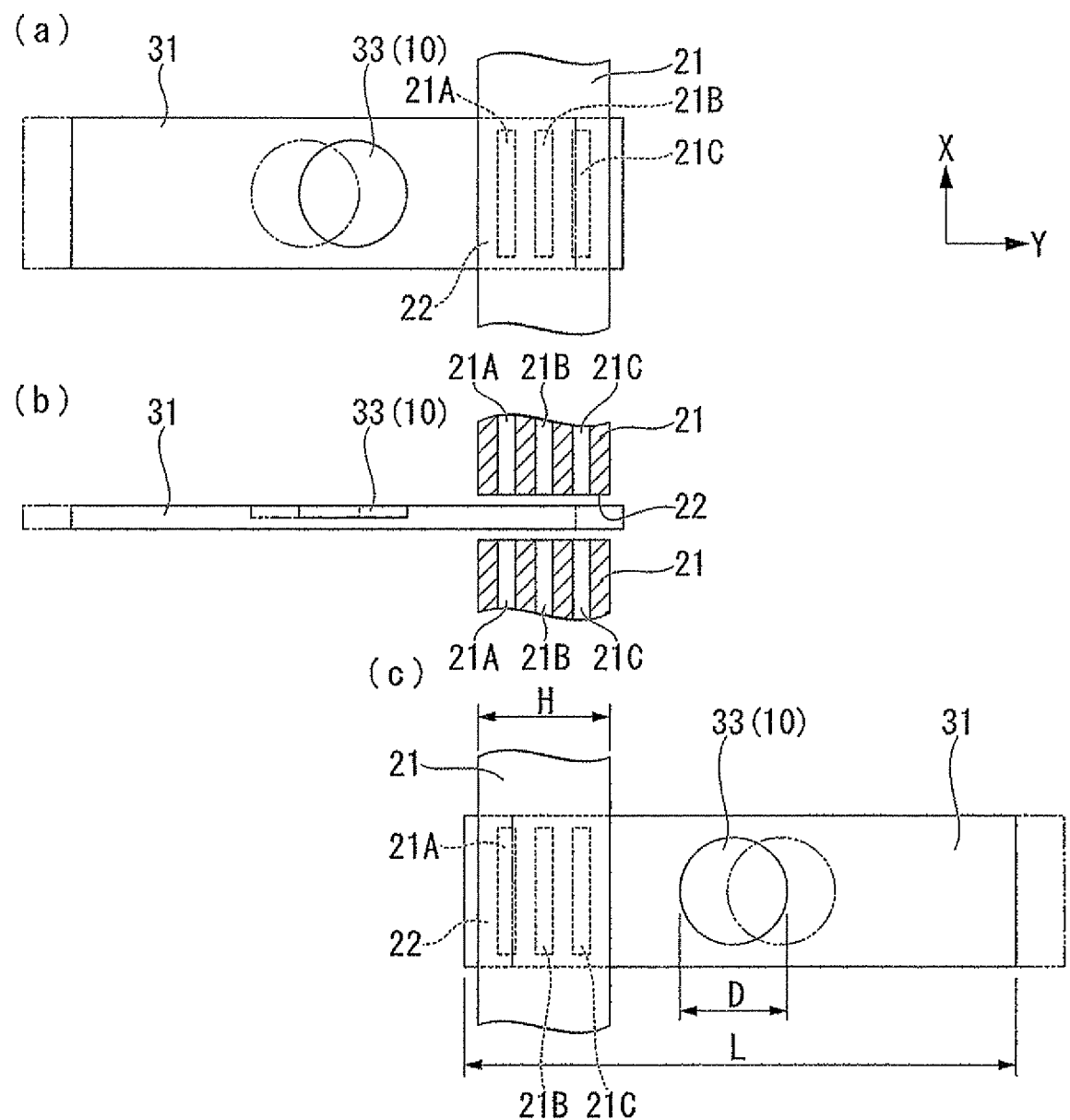
FIG. 14 is diagram for explaining transport of the wafer by the load plate in the second embodiment.

In the case of this embodiment, a dimension related to the Y direction of the load plate 31 is set to be larger the summed dimensions of a dimension related to the Y direction of the partition wall 21 in the opening portion 22 and a dimension related to the Y direction of the wafer 10 (for example, the diameter of the wafer 10), as shown in FIG. 14. In part (c) of FIG. 14, when a dimension in the Y direction of the load plate 31 is L, a dimension related to the Y direction of the partition wall 21 in the opening portion 22 is H, and a dimension related to the Y direction of the wafer 10 (for example, the diameter of the wafer 10) is D, L is larger than the summed dimensions of H and D (L>H+D).

Further, in the case of this embodiment, when the load plate 31 is at the first position, as shown in part (a) and part (b) of FIG. 14, a portion of the load plate 31 is in a state where it has passed through the opening portion 22. Also, when the load plate 31 is at the second position, as shown in part (c) of FIG. 14, a portion (an end portion on the opposite side to that when the load plate is at the first position) of the load plate 31 is in a state where it has passed through the opening portion 22.

Thus, during the transport operation of the wafer 10 involved in an exposure treatment (for example, a case where the wafer 10 is moved between the chamber 20 and the clean room CR in a state where the inside of the chamber 20 is set to be a given degree of vacuum), it becomes possible to make a portion of the load plate 31 always pass through the opening portion 22 and also appropriately adjust the clearance between the partition wall 21 and the load plate 31 by the adjustment device 32. Therefore, the movement of gas between the inside of the chamber 20 and the clean room CR through the opening portion 22 can be prevented (regulated), so that it becomes possible to maintain the inside of the chamber 20 in a given vacuum state.

In addition, the load plate 31 may also be in a state where the load plate does not pass through the opening portion 22, but is inserted into the opening portion 22 up to a mid-point in a direction along the movement pathway of the load plate 31. Also in this case, since the opening portion 22 is not opened (fully opened), it is possible to prevent (regulate) the movement of gas between the inside of the chamber 20 and the clean room CR through the opening portion 22. At this time, it is possible to appropriately set the amount (a dimension in the Y direction) of the inserted load plate 31 into the opening portion 22 in accordance with, for example, the quantity of the flow of gas which is sucked by the exhaust port 21A, the stopped time of the load plate 31, or the like. However, for example, during the transport operation, it is preferable if a setting is made such that the load plate 31 is in a state where it always faces the exhaust port 21C (a state shown by a two-dot chain line in parts (a), (b) and (c) of FIG. 14). Also, it is preferable if a setting is made such that the load plate 31 and the inner wall surface of the opening portion 22 face each other in the order of several tens of mm before and after the exhaust port 21C in the Y direction (a moving direction). However, the invention is not to be limited thereto.

In this manner, also in this embodiment, since the air in the clean room CR that flows into the chamber 20 through the third air pressure chamber 50 through which the load plate 31 passes is blocked, it becomes possible to easily increase the degree of low pressure (the degree of vacuum) of the chamber 20, it is possible to prevent increases in the size and price of the apparatus, as in the case of connecting and using a plurality of chambers, and it is possible to improve throughput without the requirement of wasted time until the inside of the chamber 20 is made to be at low pressure. Also, in this embodiment, since the whole of the wafer 10 falls within the third air pressure chamber 50, a situation can be prevented where the clearance between the wafer 10 and the support portion 33 becomes a flow path which makes the clean room CR be communicated with the chamber 20, so that air flows into the chamber 20, whereby the degree of low pressure (the degree of vacuum) is lowered.

Some embodiments have been described above with reference to the accompanying drawings. However, it is needless to say that the present invention is not limited to the related examples. The various shapes, combinations, or the like of the respective constituent members shown in the above-described examples is one example, and various modifications can be made on the basis of design requirements or the like within the scope which does not depart from the essential points of the present invention.

For example, in each of the above-described embodiments, a case where the transport apparatus is constituted as a wafer transport apparatus in the exposure apparatus EX has been described as an example. However, the invention may also be applied to a mask (reticle) transport apparatus.

Also, the width in the Y direction of the partition wall 21 in the first embodiment is shown to be smaller than the outer diameters of the wafer 10 and the support portion 33, as shown in FIGS. 4 and 5, for example. However, the invention is not to be limited thereto. For example, similarly to the second embodiment, by making the width in the Y direction of the partition wall 21 larger than the outer diameters of the wafer 10 and the support portion 33, the same effects as those explained in the second embodiment can be obtained.

Figure 10:
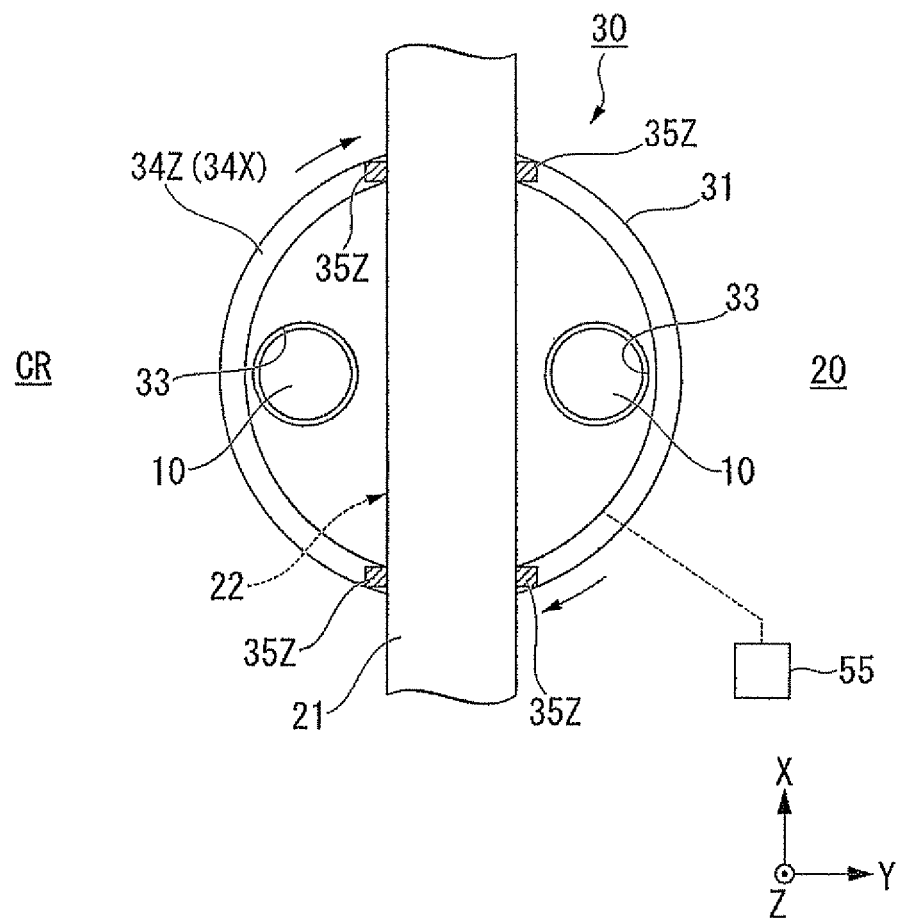
FIG. 10 is a partial plan view showing another configuration of the transport apparatus.

Also, in the above-described embodiments, a configuration is provided in which the load plate 31 is made into a plate form of a rectangle in a plan view and the wafer 10 is transported between the clean room CR and the chamber 20 by driving the load plate 31. However, the invention is not to be limited thereto, but, for example, as shown in FIG. 10, a configuration is also acceptable in which the load plate 31 is made into a disc shape and to be able to rotate about a rotary shaft provided at the partition wall 21 to extend in the Z direction and is rotated about an axis parallel to the Z direction by a rotary drive device 55. In this configuration, for example, two support portions 33 are symmetrically disposed with the rotary shaft interposed therebetween, and the wafers 10 can be sequentially moved between the clean room CR and the chamber 20 through the opening portion 22 by rotating the load plate 31.

Also, a configuration may also be made such that at each of the inside and the outside of the chamber 20, a plurality of support portions 33 is exposed to each space. By providing a plurality of support portions 33, a plurality of wafers can be individually treated with respect to each support portion, so that the throughput can be improved.

Also, in the above-described embodiments, a configuration is provided in which the support portion 33 is provided at one face of the load plate 31. However, the invention is not to be limited thereto, but a configuration is also acceptable in which the support portions 33 are provided at both faces of the load plate 31 and plural sheets of wafers 10 are simultaneously transported. In this case, transport efficiency of the wafer 10 is drastically improved, so that production efficiency can be improved. In the embodiments, the amount of clearance between the inserted load plate 31 into the opening portion 22 and the partition wall 21 is adjusted to suppress the movement of fluid from the first space to the second space; however, the present invention is not limited thereto.

Also, in the above-described embodiments, the opening portion 22 and the third air pressure chamber 50 have been explained as those having a cross-section shape of a substantial rectangle extending in the horizontal direction. However, the invention is not to be limited thereto, but a configuration is also acceptable in which they have a cross-section shape of a substantial rectangle extending, for example, in the vertical direction. In this case, a footprint (an installation area) is reduced, so that it becomes possible to reduce a proprietary area in a factory. Also, in the case of adopting the above-described configuration in which the support portions 33 are provided at both faces of the load plate 31, safety can be increased by sucking and attaching the wafers 10 to the load plate 31 in the horizontal direction.

Also, in each of the above-described embodiments, the exposure apparatus EX is in a state where the periphery thereof is surrounded by the clean room CR. However, the invention is not to be limited to such a configuration. The invention may also be applied to, for example, a case where a plurality of chambers is consecutively disposed and the substrate is transported through the opening portions provided at the partition walls for partitioning these chambers.

Also, in each of the above-described embodiments, an example in which the transport apparatus according to the present invention is applied to the exposure apparatus is shown. However, the invention is not to be limited thereto, but can be widely applied to an apparatus which transports the substrate between a plurality of air pressure chambers being different in air pressure. For example, the invention can be applied to the case of transporting the substrate to a deposition apparatus which performs a deposition treatment such as sputtering on the substrate in a vacuum chamber, or the like.

Further, in each of the above-described embodiments, the adjustment device is constituted such that the transport apparatus (the load plate 31) moves with respect to the partition wall. However, the invention is not to be limited thereto. For example, a configuration may also be made such that a moving member is also provided at the partition wall side and the partition wall and the transport apparatus are moved in the reverse direction while adjusting the amount of clearance between the partition wall and the transport apparatus (the load plate 31). Also, a configuration may also be made such that the transport apparatus (the load plate 31) side is fixed and a portion (a portion facing the transport apparatus) of the partition wall moves with respect to the transport apparatus.

In addition, as the substrate in each of the above-described embodiments, not only a semiconductor wafer for manufacturing a semiconductor device, but also a glass substrate for a display device, a ceramic wafer for a thin-film magnetic head, or the like is applied. Alternatively, the invention is also applicable to an original plate (synthetic quartz or silicon wafer) of a mask or a reticle which is used in the exposure apparatus, or the like.

As the exposure apparatus EX, besides a scanning type exposure apparatus (a scanning stepper) of a step-and-scanning system in which scanning exposure of a pattern of the reticle 2 is performed by synchronously moving the reticle 2 and the wafer 10, a projection exposure apparatus (a stepper) of a step-and-repeat system in which batch exposure of a pattern of the reticle 2 is performed in a state where the reticle 2 and the wafer 10 are at rest, and the wafer 10 is sequentially step-moved is also applicable.

Further, in the exposure of a step-and-repeat system, a configuration is also acceptable in which a reduced image of a first pattern is transferred to a substrate by using a projection optical system in a state where the first pattern and the substrate are nearly at rest, and then batch exposure of a reduced image of a second pattern to the substrate is performed to be partially overlapped with the first pattern by using the projection optical system in a state where the second pattern and the substrate are nearly at rest (a batch exposure apparatus of a stitching system). Also, as the exposure apparatus of a stitching system, an exposure apparatus of a step-and-stitch system in which at least two patterns are transferred to a substrate to be partially overlapped and in which the substrate is sequentially moved is also applicable.

Also, the present invention can also be applied to, for example, an exposure apparatus in which patterns of two masks are combined on a substrate through a projection optical system and in which one shot region on the substrate is nearly simultaneously double-exposed by single scanning exposure, as disclosed in U.S. Pat. No. 6,611,316, or the like. Also, the present invention can also be applied to an exposure apparatus of a proximity system, a mirror projection aligner, or the like.

Also, the present invention can also be applied to a twin stage type exposure apparatus in which a plurality of substrate stages (wafer stages) is provided. A structure and an exposure operation of the twin stage type exposure apparatus are disclosed in, for example, JP-A-10-163099 and JP-A-10-214783 (corresponding U.S. Pat. Nos. 6,341,007; 6,400,441; 6,549,269; and 6,590,634), JP-T-2000-505958 (corresponding U.S. Pat. No. 5,969,441), or U.S. Pat. No. 6,208,407. Further, the present invention may also be applied to a wafer stage of Japanese Patent Application No. 2004-168481 which was previously filed by the applicant of this application.

Further, the present invention can also be applied to, for example, an exposure apparatus having a substrate stage which holds a substrate, and a measuring stage which is provided with a reference member with a reference mark formed and/or various photoelectric sensors and does not hold the substrate which is an object to be exposed, as disclosed in U.S. Pat. No. 6,897,963 or the like. In addition, the present invention can also be applied to an exposure apparatus having a plurality of substrate stages and a measuring stage.

The kind of exposure apparatus EX is not limited to an exposure apparatus for manufacturing a semiconductor element, which exposes a semiconductor element pattern to a substrate, but may be an exposure apparatus for manufacturing a liquid crystal display element or a display, an exposure apparatus for manufacturing a thin-film magnetic head, an imaging element (CCD), a micromachine, a MEMS, a DNA chip, reticle, or mask, or the like.

Also, in this embodiment, a case where the exposing light is EUV light is explained as an example. However, as exposing light, for example, far-ultraviolet light (DUV light) such as an emission line (g line, h line, or i line) which is emitted from a mercury lamp, or a KrF excimer laser light (wavelength: 248 nm), a vacuum-ultraviolet light (VUV light) such as an ArF excimer laser light (wavelength: 193 nm) or a F2 laser light (wavelength: 157 nm), or the like can also be used. In this case, the chamber 20 does not need to be necessarily adjusted to a vacuum state, but can be filled with, for example, gas of a pressure different from atmospheric pressure. In the case of filling it with gas, in order to maintain the environment of the chamber 20 filled with gas, it is preferable if the substrate is transported by the transport apparatus 30 of this embodiment.

As described above, the exposure apparatus EX of this embodiment is manufactured by assembling various subsystems which include the respective constituent elements, so as to keep the given mechanical precision, electrical precision, and optical precision. In order to secure the various precisions mentioned above, before or after the assembly, adjustment for achieving the optical precision with respect to various optical systems, adjustment for achieving the mechanical precision with respect to various mechanical systems, and adjustment for achieving the electrical precision with respect to various electrical systems are performed. An assembly process from various subsystems to the exposure apparatus includes mechanical connection of various subsystems, wiring connection of an electric circuit, piping connection of an air-pressure circuit, etc. It is needless to say that an assembly process of each subsystem is performed before the assembly process from various subsystems to the exposure apparatus. If the assembly process of various subsystems to the exposure apparatus is finished, general coordination is performed, so that various precisions for the whole of the exposure apparatus are secured. In addition, it is preferable that the manufacturing of the exposure apparatus is performed in a clean room with managed temperature, cleanliness, and the like.

Figure 11:
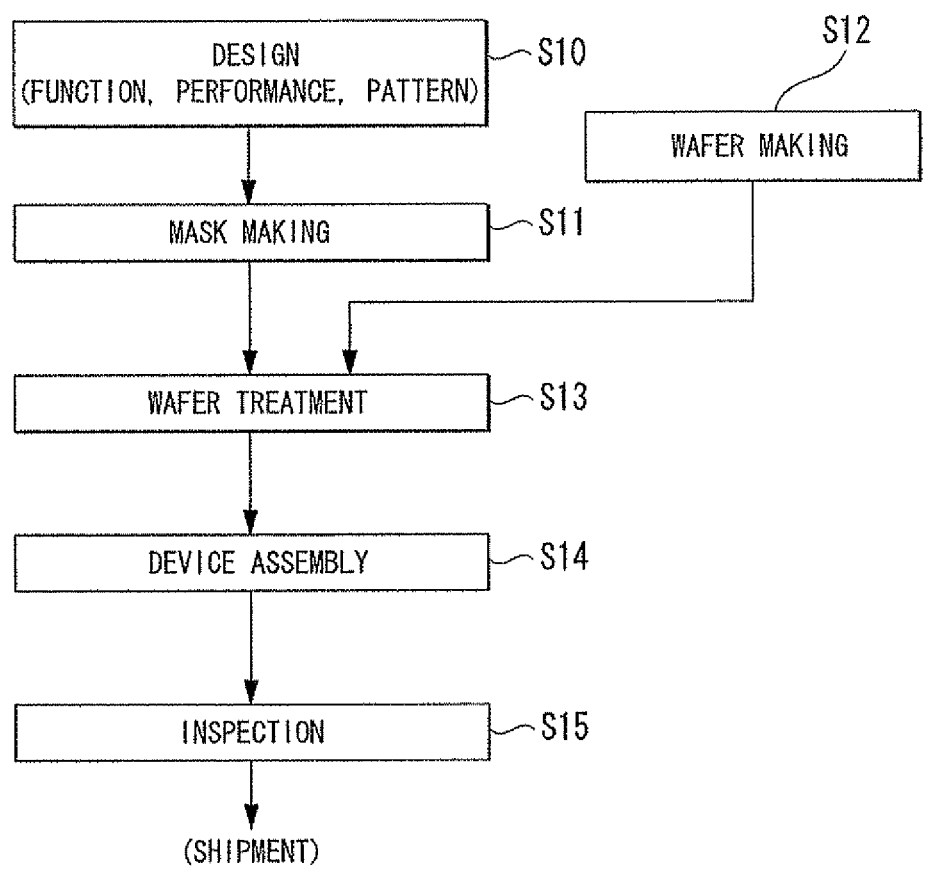
FIG. 11 is a flowchart illustrating one example of a manufacturing process of a microdevice according to the present invention.

Next, an embodiment of a manufacturing method of a microdevice in which the exposure apparatus and exposure method according to the embodiments of the present invention are used in a lithography process is described. FIG. 11 is a diagram showing a flowchart of a manufacturing example of the microdevice (a semiconductor chip such as an IC or a LSI, a liquid crystal panel, a CCD, a thin-film magnetic head, a micromachine, or the like). First, in Step S10 (a design step), function and performance design of the microdevice (for example, circuit design or the like of a semiconductor device) is performed, and pattern design for realizing the function is performed. Subsequently, in Step S11 (a mask making step), a mask (reticle) with a designed circuit pattern formed thereon is manufactured. On the other hand, in Step S12 (a wafer making step), a wafer is made by using a material such as silicon.

Next, in Step S13 (a wafer treatment step), by using the mask and the wafer prepared in Step 10 to Step 12, an actual circuit, etc. is formed on the wafer by lithography technology or the like, as described later. Next, in Step S14 (a device assembly step), device assembly is performed by using the wafer treated in Step 13. In this Step 14, processes such as a dicing process, a bonding process, and a packaging process (chip sealing) are included as necessary. Finally, in Step 15 (an inspection step), an inspection such as an operation confirmation test, a durability test, or the like of the microdevice manufactured in Step 14 is performed. The microdevice is completed through the steps and shipped.

Figure 12:
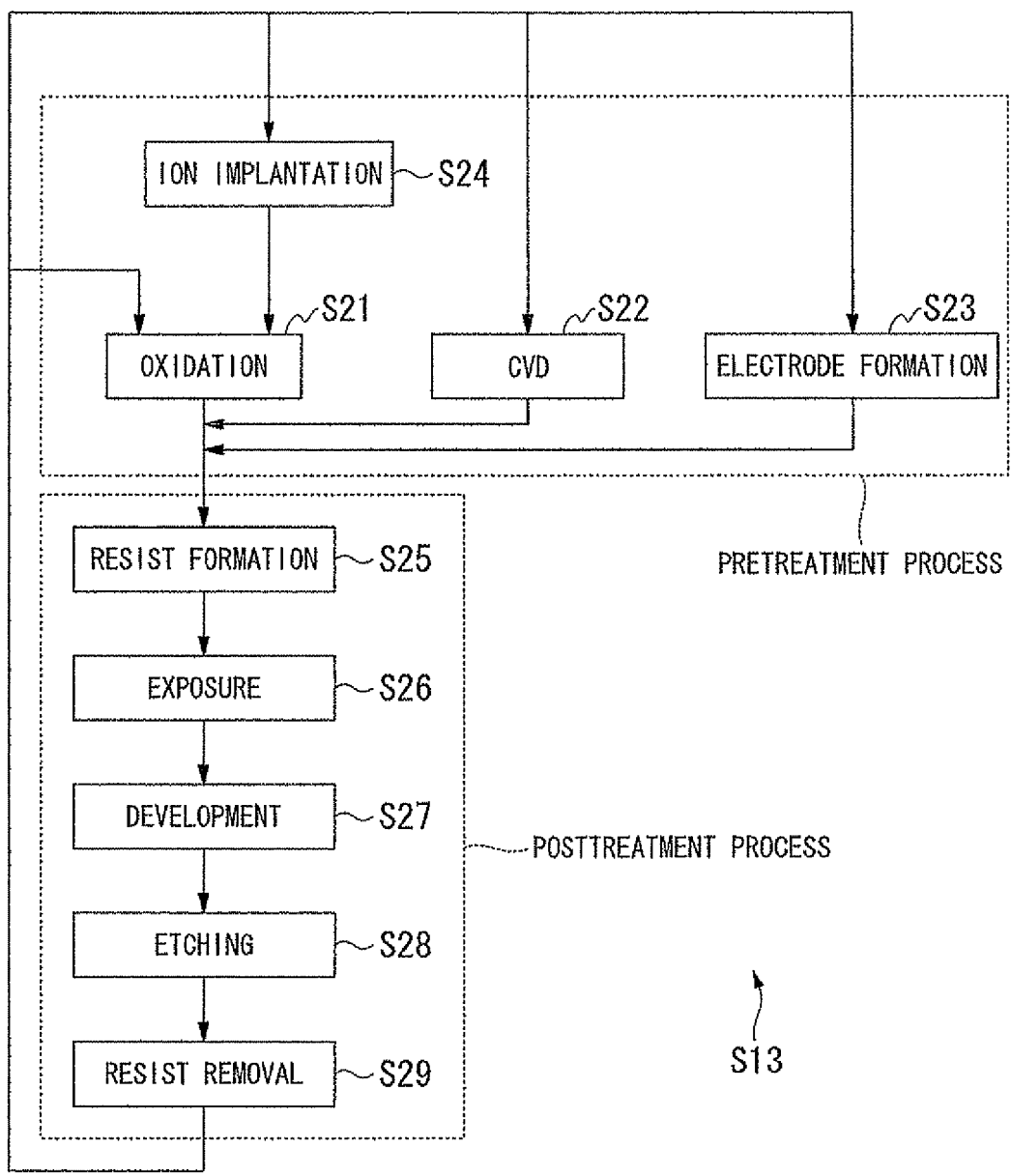
FIG. 12 is a diagram illustrating one example of the detailed process of Step S13 in FIG. 11.

FIG. 12 is a diagram illustrating one example of the detailed process of Step S13 in the case of a semiconductor device.

In Step S21 (an oxidation step), the surface of the wafer is oxidized. In Step S22 (a CVD step), an insulating film is formed on the surface of the wafer. In Step S23 (an electrode formation step), an electrode is formed on the wafer by vapor deposition. In Step S24 (an ion implantation step), ions are implanted to the wafer. Each of Step S21 to Step S24 described above constitutes a pretreatment process of each stage of the wafer treatment and is selected and carried out in accordance with a treatment required in each stage.

At each stage of the wafer process, if the above-described pretreatment process is finished, an aftertreatment process is carried out as described below. In the aftertreatment process, first, in Step S25 (a resist formation step), a photosensitizing agent is coated on the wafer. Subsequently, in Step S26 (an exposure step), a circuit pattern of the mask is transferred to the wafer by the lithography system (the exposure apparatus) and the exposure method, which are described above. Next, in Step S27 (a development step), the exposed wafer is developed, and in Step S28 (an etching step), an exposed member of a portion other than a portion where the resist remains is removed by etching. Then, in Step S29 (a resist removal step), the resist no longer required due to the ending of the etching is removed. Circuit patterns are multiply formed on the wafer by repeatedly performing the pretreatment and the aftertreatment.

Also, the present invention can be applied to not only the microdevice such as a semiconductor element, but also an exposure apparatus which transfers a circuit pattern from a mother reticle to a glass substrate, a silicon wafer, or the like in order to manufacture a reticle or a mask, which is used in a light exposure apparatus, an EUV exposure apparatus, a X-ray exposure apparatus, an electron beam exposure apparatus, or the like. Here, in an exposure apparatus which uses DUV (deep-ultraviolet) light, VUV (vacuum-ultraviolet) light, or the like, in general, a transmission type reticle is used, and as a reticle substrate, quartz glass, quartz glass with fluorine doped, fluorite, magnesium fluoride, crystal, or the like is used. Also, in an X-ray exposure apparatus of a proximity system, an electron beam exposure apparatus, or the like, a transmission type mask (a stencil mask or a membrane mask) is used, and as a mask substrate, a silicon wafer or the like is used. In addition, such exposure apparatuses are disclosed in WO99/34255, WO99/50712, WO99/66370, JP-A-11-194479, JP-A-2000-12453, JP-A-2000-29202, etc.

In a transport apparatus in one embodiment, when the substrate (10) is transported from the first space (a first air pressure chamber) of high pressure to the second space (a second air pressure chamber) of low pressure through the opening portion (22) by the support device (31), a clearance between the support device and the partition wall in the opening portion can be adjusted to a minutely small amount by the adjustment device (32). Therefore, in the embodiment, the gas in the first space flows from a clearance between the support device and the partition wall in the opening portion into the second space, whereby an increase in the air pressure of the second space can be suppressed. Therefore, in the embodiment, it becomes possible to easily increase the degree of low pressure (for example, the degree of vacuum) of the second space, for example, without consecutively providing a plurality of air pressure chambers each forming each space, or the like, so that increases in size and price of the apparatus can be prevented and the throughput can also be improved.

In a transport apparatus in one embodiment, for example, when the substrate (10) is transported from the first space of high pressure to the second space of low pressure through the third space (50) by the support device (31), by negative-pressure-sucking the third space, the gas in the first space flows into the second space through the third space, whereby an increase in the air pressure of the second space can be suppressed. As a suction device, in general, since the device has a negative-pressure suction characteristic in which, in the case of obtaining lower pressure, it is possible to suck a small quantity of gas, and conversely, in the case of sucking a large quantity of gas, it is difficult to increase the degree of low pressure, by negative-pressure-sucking the third space by a plurality of suction portions (21A to 21C) each having a negative-pressure suction characteristic, it is possible to increase the degree of low pressure of the third space while sucking gas, which heads to the second space, in a large quantity in the third space, and consequently, it becomes possible to maintain the degree of low pressure of the second space. Therefore, in the embodiment, it becomes possible to easily increase the degree of low pressure (for example, the degree of vacuum) of the second space without consecutively providing a plurality of air pressure chambers each forming a space, so that increases in size and price of the apparatus can be prevented and also so that throughput can be improved.

In a exposure apparatus in one embodiment, for example, by a reduction in size, a lower price, and higher throughput of the apparatus related to the transport of the substrate, a reduction in size, a lower price, and a higher throughput of the exposure apparatus can be realized.

What is claimed is:

1. A transport apparatus configured to transport a substrate between a first space and a second space, which are separated by a partition wall and are arranged along a first direction, through an opening portion formed in the partition wall, the apparatus comprising:
    a support member that is movable relative to the opening portion and includes (i) a support portion that supports the substrate, (ii) a first portion that is inserted into the opening portion when the support portion is positioned inside the first space, and (iii) a second portion that is inserted into the opening portion when the support portion is positioned inside the second space;
    a driving device that drives the support member along the first direction; and
    an adjustment device that adjusts, with respect to a second direction that crosses the first direction, an amount of a clearance between the partition wall and at least one of the first portion positioned inside the opening portion and the second portion positioned inside the opening portion by use of information regarding a clearance between the partition wall and at least one of the first portion positioned inside the opening portion and the second portion positioned inside the opening portion.

2. The transport apparatus according to claim 1, wherein when the support portion is positioned inside the second space, in a state where the second portion is inserted into the opening portion, one of a loading of the substrate on the support portion and an unloading of the substrate from the support portion is performed.

3. The transport apparatus according to claim 1,
    wherein the support member moves in a given direction, thereby moving the support portion between the first space and the second space, and a dimension of the support member in the given direction is larger than a summed dimension of (i) a dimension of the partition wall at the opening portion in the given direction and (ii) a dimension of the substrate in the given direction.

4. The transport apparatus according to claim 3, wherein the dimension of the support member in the given direction is equal to or more than three times the dimension of the substrate in the given direction.

5. The transport apparatus according to claim 3, wherein the dimension of the opening portion in the given direction is equal to or more than the dimension of the substrate in the given direction.

6. The transport apparatus according to claim 1, wherein the adjustment device includes
a first member formed of a magnetic material and provided at the support member along a movement direction of the substrate, and
a second member that is arranged to face the first member and adjusts a distance between the second member and the first member by an electromagnetic force which is generated between the second member and the first member.

7. The transport apparatus according to claim 6, wherein the first member and the second member are respectively provided on one side in a vertical direction of the support member and on both sides in a horizontal direction orthogonal to the movement direction of the support member.

8. The transport apparatus according to claim 1, further comprising
a measuring device connected to the adjustment device the measuring device measuring an amount of the clearance between the partition wall and at least one of the first portion positioned inside the opening portion and the second portion positioned inside the opening portion.

9. The transport apparatus according to claim 8, wherein the adjustment device adjusts the amount of the clearance by use of a measurement result of the measuring device.

10. The transport apparatus according to claim 1, further comprising:
an exhaust device which has at least one exhaust port and exhausts fluid that is in a vicinity of the opening portion of the partition wall from the at least one exhaust port.

11. The transport apparatus according to claim 10, wherein the at least one exhaust port is facing to the opening portion of the partition wall.

12. The transport apparatus according to claim 1, wherein the support member has a substantially rectangular cross-section shape, and
the opening portion has a cross-section shape of a substantial rectangle extending in a horizontal direction.

13. The transport apparatus according to claim 1, wherein the support portion is disposed in a recessed portion of the support member.

14. The transport apparatus according to claim 13, wherein a depth of the recessed portion is substantially equal to a thickness of the substrate.

15. The transport apparatus according to claim 1, wherein the support portion has an electrostatic chuck.

16. The transport apparatus according to claim 1, wherein the driving device rotates the support member, thereby rotationally moving the support portion between the first space and the second space.

17. The transport apparatus according to claim 1, wherein pressure of the first space and pressure of the second space are different from each other.

18. The transport apparatus according to claim 1, wherein the driving device drives the support member to reciprocate linearly in the first direction to transport the substrate between the first and second spaces.

19. An exposure apparatus comprising:
a chamber member which forms an exposure space;
a substrate holding device disposed in the exposure space; and
the transport apparatus according to claim 1, which transports a substrate from an outside of the exposure space to the substrate holding device, wherein
the first space is the exposure space, and the partition wall is a portion of the chamber member.

20. A device manufacturing method comprising:
exposing an object by use of the exposure apparatus according to claim 19; and
developing the exposed object.

21. The transport apparatus according to claim 1, further comprising:
a third space that is arranged between the first space and the second space and forms at least part of a movement path of the substrate during the transport; and
an exhaust device configured to exhaust a gas in the third space, wherein:
the first portion of the support member is positioned inside the third space when the support portion is positioned inside the first space,
the second portion of the support member is positioned inside the third space when the support portion is positioned inside the second space,
the exhaust device includes a plurality of exhaust portions arranged along the movement path of the substrate inside the third space and having a different exhaust characteristic from each other, and
in a state where the support portion is positioned inside the first space and the first portion is positioned inside the third space, one of a loading of the substrate on the support portion and an unloading of the substrate from the support portion is performed.

22. The transport apparatus according to claim 21, wherein the plurality of exhaust portions of the exhaust device are arranged along the movement path in accordance with a magnitude of an exhaust capacity of each portion.

23. The transport apparatus according to claim 21, wherein the plurality of exhaust portions of the exhaust device are arranged along the movement path in accordance with a magnitude of an exhaust velocity of each of the exhaust portions.

24. The transport apparatus according to claim 21, wherein the first space is set to a higher pressure than a pressure of the second space, and
the plurality of exhaust portions include a first exhaust portion and a second exhaust portion arranged closer to the first space than the first exhaust portion and having a larger exhaust capacity than an exhaust capacity of the first exhaust portion.

25. The transport apparatus according to claim 21, wherein a dimension along the first direction of the third space is greater than a dimension along the first direction of the substrate supported by the support portion.

* * * * *